(12) United States Patent
Xu et al.

(10) Patent No.: US 11,947,858 B2
(45) Date of Patent: Apr. 2, 2024

(54) DISPLAY PANEL AND DISPLAY DEVICE

(71) Applicant: BOE TECHNOLOGY GROUP CO., LTD., Beijing (CN)

(72) Inventors: Zhiqiang Xu, Beijing (CN); Tieshi Wang, Beijing (CN); Weixing Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 72 days.

(21) Appl. No.: 17/765,500

(22) PCT Filed: Jun. 8, 2021

(86) PCT No.: PCT/CN2021/098863
§ 371 (c)(1),
(2) Date: Mar. 31, 2022

(87) PCT Pub. No.: WO2021/249381
PCT Pub. Date: Dec. 16, 2021

(65) Prior Publication Data
US 2022/0382501 A1    Dec. 1, 2022

(30) Foreign Application Priority Data

Jun. 10, 2020 (CN) .......................... 202010521207.9

(51) Int. Cl.
G06F 3/14 (2006.01)
G06F 3/01 (2006.01)
H05K 5/00 (2006.01)

(52) U.S. Cl.
CPC ............... G06F 3/14 (2013.01); G06F 3/013 (2013.01); H05K 5/0018 (2022.08)

(58) Field of Classification Search
CPC .. G06F 3/013; G06F 3/14; G09F 9/30; G09G 3/20; G09G 2300/0426; H05K 5/0018
See application file for complete search history.

(56) References Cited

U.S. PATENT DOCUMENTS 11,204,534 B2 * 12/2021 Yeh ...................... H10K 59/131
2015/0285976 A1    10/2015 Lee et al.
(Continued)

FOREIGN PATENT DOCUMENTS

| CN | 104866271 A | 8/2015 |
|---|---|---|
| CN | 107845663 A | 3/2018 |

(Continued)

OTHER PUBLICATIONS

China Patent Office, First Office Action dated Jul. 28, 2021 for application No. CN202010521207.9.
(Continued)

*Primary Examiner* — Nelson M Rosario
(74) *Attorney, Agent, or Firm* — HOUTTEMAN LAW LLC

(57) ABSTRACT

A display panel and a display device are disclosed. The display panel includes a first sub-panel (1), a second sub-panel (2), a drive unit (4) and an image acquisition unit (3). The first sub-panel (1) has a transparent area (S1) and a display area (S2) surrounding the transparent area (S1). The second sub-panel (2) is on a side of the first sub-panel (1) away from a display surface. The drive unit (4) is connected to the second sub-panel (2) and can drive the second sub-panel (2) to move back and forth between positions corresponding to the transparent area (S1) and the display area (S2) of the first sub-panel (1). The image acquisition unit (3) is on a side of the second sub-panel (2) away from the first sub-panel (1), and an orthographic projection thereof on the first sub-panel (1) is within the transparent area (S1).

20 Claims, 7 Drawing Sheets

(56) References Cited

U.S. PATENT DOCUMENTS

| | | | |
|---|---|---|---|
| 2018/0190190 A1* | 7/2018 | Xi | G09G 3/3208 |
| 2019/0137817 A1* | 5/2019 | Yasui | G02F 1/133536 |
| 2019/0172844 A1* | 6/2019 | Su | H01L 27/124 |
| 2020/0133422 A1 | 4/2020 | Maalouf | |

FOREIGN PATENT DOCUMENTS

| | | |
|---|---|---|
| CN | 108376019 A | 8/2018 |
| CN | 108682299 A | 10/2018 |
| CN | 109104510 A | 12/2018 |
| CN | 109119447 A | 1/2019 |
| CN | 208384466 U | 1/2019 |
| CN | 109788098 A | 5/2019 |
| CN | 110492018 A | 11/2019 |
| CN | 110675754 A | 1/2020 |
| CN | 111627335 A | 9/2020 |

OTHER PUBLICATIONS

China Patent Office, Second Office Action dated Mar. 23, 2022 for application No. CN202010521207.9.

* cited by examiner

DISPLAY PANEL AND DISPLAY DEVICE

CROSS-REFERENCE TO RELATED APPLICATION

This application claims priority to Chinese patent application No. 202010521207.9, filed to the China National Intellectual Property Administration (CNIPA) on Jun. 10, 2020, the contents of which are incorporated herein by reference in their entirety.

TECHNICAL FIELD

The present disclosure relates to the field of display technology, and in particular, to a display panel and a display device.

BACKGROUND

With the development of display technology, full-screen display has become a trend for display panels. However, in the related art, a display panel needs to be provided with an image acquisition unit (e.g., a camera), and the camera needs to occupy a part of a display area of the display panel, and therefore, playing an image on the entire panel of the display panel cannot be actually achieved.

SUMMARY

Embodiments of the present disclosure provide a display panel, including:
  a first sub-panel having a transparent area and a display area surrounding the transparent area;
  a second sub-panel on a side of the first sub-panel away from a display surface of the first sub-panel;
  a drive unit connected to the second sub-panel and capable of driving the second sub-panel to move back and forth between positions respectively corresponding to the transparent area and the display area of the first sub-panel; and
  an image acquisition unit on a side of the second sub-panel away from the first sub-panel, an orthographic projection of the image acquisition unit on the first sub-panel being within the transparent area.

In some implementations, an area of an orthographic projection of the second sub-panel on the first sub-panel is greater than or equal to an area of the transparent area.

In some implementations, the transparent area is circular in shape.

In some implementations, the first sub-panel includes a substrate, a plurality of gate lines and a plurality of data lines on a side of the substrate close to the display surface; where
  the plurality of gate lines extend along a first direction and are arranged in the display area and the transparent area;
  the plurality of data lines extend along a second direction and are arranged in the display area and the transparent area; and
  widths of both the plurality of gate lines and the plurality of data lines are micron-sized.

In some implementations, the first sub-panel includes a substrate, a plurality of gate lines and a plurality of data lines on a side of the substrate close to the display surface; where
  the plurality of gate lines extend along a first direction and are arranged only in the display area;
  and/or,
  the plurality of data lines extend along a second direction and are arranged only in the display area.

In some implementations, in a case where the plurality of gate lines are arranged only in the display area, the first sub-panel further includes a plurality of first bridging lines, and gates lines, which ought to pass through the transparent area, of the plurality of gate lines are each broken at a border of the transparent area and the display area and separated into two parts, and each of the plurality of first bridging lines is arranged in the display area and connects together the two parts into which a gate line corresponding thereto is separated;
  and/or
  in a case where the plurality of data lines are arranged only in the display area, the first sub-panel further includes a plurality of second bridging lines, and data lines, which ought to pass through the transparent area, of the plurality of data lines are each broken at a border of the transparent area and the display area and separated into two parts, and each of the plurality of second bridging lines is arranged in the display area and connects together the two parts into which a data line corresponding thereto is separated.

In some implementations, in a case where the plurality of gate lines or the plurality of data lines are also arranged in the transparent area, widths of the plurality of gate lines or the plurality of data lines are micron-sized.

In some implementations, in a case where the plurality of gate lines are arranged only in the display area, the first sub-panel further includes a first additional layer, the first additional layer is on a side of a layer where the plurality of gate lines are located away from the substrate, the plurality of first bridging lines are in the first additional layer, and each of the plurality of first bridging lines is connected to the two parts of the gate line corresponding thereto through vias in the first additional layer;
  and/or,
  in a case where the plurality of data lines are arranged only in the display area, the first sub-panel further includes a second additional layer, the second additional layer is on a side of a layer where the plurality of data lines are located away from the substrate, the plurality of second bridging lines are in the second additional layer, and each of the plurality of second bridging lines is connected to the two parts of the data line corresponding thereto through vias in the second additional layer.

In some implementations, the drive unit includes a drive member and a slide assembly; where
  the slide assembly is fixedly connected with the second sub-panel, the drive member is connected with the slide assembly, and the drive member drives the slide assembly to move back and forth to drive the second sub-panel to move back and forth.

In some implementations, the drive unit further includes a fixing assembly; the slide assembly includes a fixed part and a slide part, the fixed part is a rotating shaft, and the slide part is a sleeve; wherein
  the fixing assembly is connected with the second sub-panel, and is configured to fix the second sub-panel and keep the second sub-panel parallel to the first sub-panel;
  the sleeve is fixedly connected with the fixing assembly and is sleeved on the rotating shaft, and the drive member is connected with the rotating shaft to drive the rotating shaft to rotate; and an inner side of the sleeve is provided with threads, a surface of the rotating shaft is provided with threads, the threads of the sleeve are matched with the threads of the rotating shaft, and when the rotating shaft rotates, the sleeve drives the second sub-panel to move back and forth along the rotating shaft.

In some implementations, the fixing assembly includes a fixing plate and a clamping member; where
    the second sub-panel is placed and fixed on a side of the fixing plate close to the first sub-panel; and
    the clamping member has two slots, the two slots are located on two sides of the fixing plate to clamp and hold the fixing plate between the two slots, and the fixing plate is slidable along the two slots.

In some implementations, the display panel further includes a frame structure, and the clamping member and the drive member are fixed on the frame structure of the display panel.

In some implementations, the display panel further includes: an determination unit electrically connected to the drive unit and configured to identify an angle between a line of sight of a human eye and the display panel and drive the drive unit to drive the second sub-panel to move according to the angle, so as to adjust a relative position of the second sub-panel to the transparent area.

In some implementations, the display panel further includes: a graphics processing unit, a first timing controller and a second timing controller; wherein
    the first timing controller is connected to the graphics processing unit and the first sub-panel, and the second timing controller is connected to the graphics processing unit and the second sub-panel.

In some implementations, the graphics processing unit is configured to respectively output complete image data to the first timing controller, and output transparent-area image data corresponding to a position of the transparent area in the complete image data to the second timing controller;
    the first timing controller is configured to control the first sub-panel to display a complete image; and
    the second timing controller is configured to control the second sub-panel to display a transparent-area image.

Correspondingly, an embodiment of the present disclosure further provides a display device including the display panel as described above.

DETAIL DESCRIPTION OF EMBODIMENTS

In order to make the objective, technical solutions and advantages of the present disclosure clearer, the present disclosure will be further described in detail below with reference to the accompanying drawings. Obviously, embodiments described herein are only some, but not all, of the embodiments of the present disclosure. Based on the embodiments in the present disclosure, all other embodiments obtained by those of ordinary skill in the art without creative efforts shall fall within the protection scope of the present disclosure.

Shapes and sizes of components in the accompanying drawings are not true to scale, and are only for facilitating understanding of contents of the embodiments of the present disclosure.

Unless otherwise defined, technical terms or scientific terms used in the present disclosure should have general meanings that can be understood by those of ordinary skill in the art to which the present disclosure belongs. The words "first", "second" and the like used in the present disclosure do not denote any order, quantity, or importance, but are merely used to distinguish different elements. Similarly, the word "a", "an", "the" or the like does not denote limitation on quantity, but denotes the presence of "at least one". The word "include", "comprise" or the like indicates that an element or object before the word covers an element or object listed after the word and equivalents thereof, but does not exclude other elements or objects. The word "connect", "couple" or the like is not restricted to physical or mechanical connection, but may include electrical connection, whether direct or indirect. The words "on", "under", "left", "right" and the like are merely used to indicate relative positional relationships, and when an absolute position of an object described is changed, the relative positional relationships may be changed accordingly.

Figure 1:
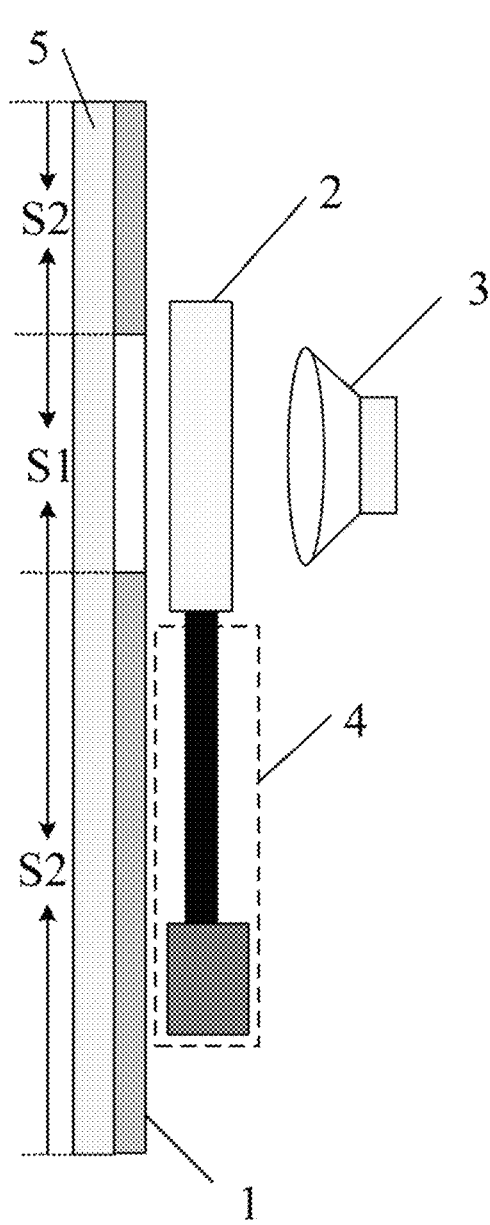
FIG. 1 is a schematic structural diagram of an implementation of a display panel (for full-screen display) according to an embodiment of the present disclosure.
Figure 2:
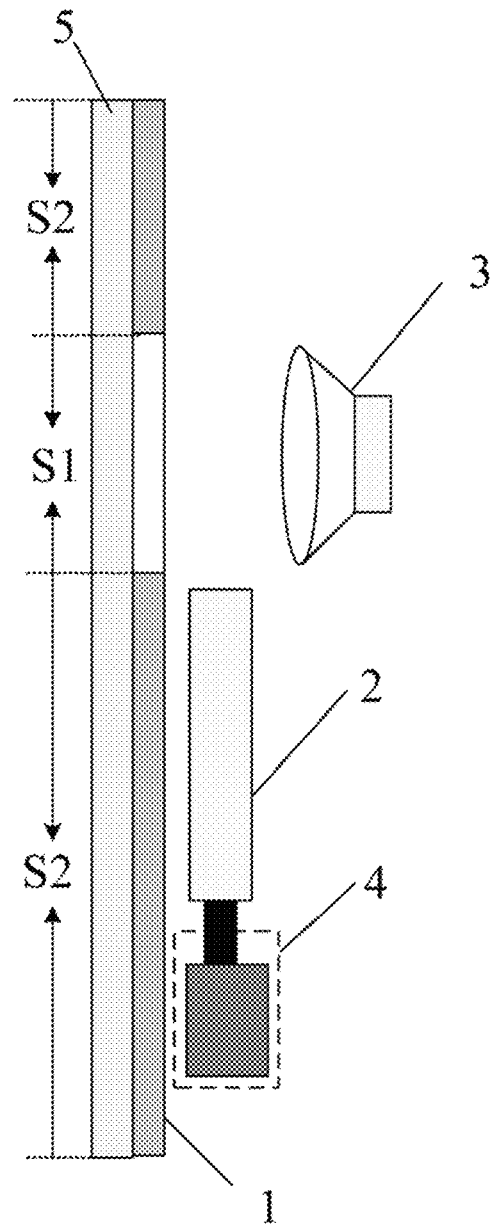
FIG. 2 is a schematic structural diagram of an implementation of a display panel (for image acquisition) according to an embodiment of the present disclosure.
Figure 3:
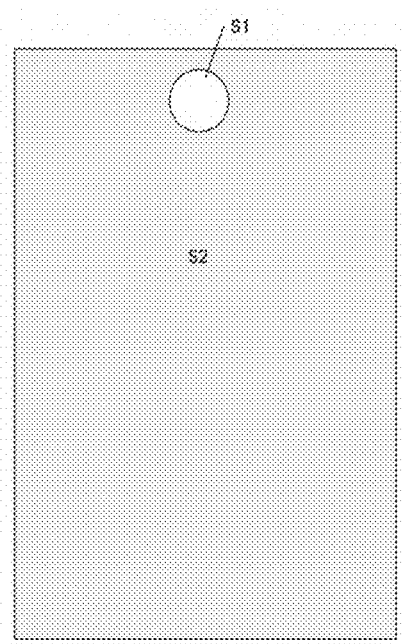
FIG. 3 is a schematic diagram of an implementation of a display area and a transparent area of a first sub-panel in a display panel according to an embodiment of the present disclosure.

As shown in FIGS. 1 to 3, an embodiment of the present disclosure provides a display panel, the display panel includes a first sub-panel 1, a second sub-panel 2, an image acquisition unit 3 and a drive unit 4.

Specifically, referring to FIG. 3, the first sub-panel 1 has a transparent area S1 and a display area S2. The display area S2 surrounds the transparent area S1, the display area S2 of the first sub-panel 1 is provided with pixel units and may be used for displaying an image, and the transparent area S1 of the first sub-panel 1 may allow light to transmit therethrough. In the embodiment, the transparent area S1 is in a shape of a circle, as shown in FIG. 3, and certainly, it may also be in other shapes, such as a square, which is not limited here. Referring to FIGS. 1 and 2, the second sub-panel 2 is disposed on a side of the first sub-panel 1 away from a display surface of the first sub-panel 1. The image acquisition unit 3 is disposed on a side of the second sub-panel 2 away from the first sub-panel 1, and an orthographic projection of the image acquisition unit 3 on the first sub-panel 1 is located in the transparent area S1 of the first sub-panel 1. That is, the image acquisition unit 3 is disposed directly below the transparent area S1 of the first sub-panel 1 to ensure that the image acquisition unit 3 can acquire an image through the transparent area S1 of the first sub-panel 1. The image acquisition unit 3 may be any device having an image acquisition function, for example, the image acquisition unit 3 may be a camera. The drive unit 4 is connected to the second sub-panel 2, and can drive the second sub-panel 2 to move back and forth between positions corresponding to the transparent area S1 and the display area S2 of the first sub-panel 1. That is, the drive unit 4 can drive the second sub-panel 2 to move to the position corresponding to the transparent area S1 of the first sub-panel 1 (as shown in FIG. 1), or drive the second sub-panel 2 to move from the position corresponding to the transparent area S1 of the first sub-panel 1 to the position corresponding to the display area S2 (as shown in FIG. 2) such that the first sub-panel 1 blocks the second sub-panel 2, and the transparent area S1 of the first sub-panel 1 exposes the image acquisition unit 3.

In the display panel provided in the embodiment, the drive unit 4 can drive the second sub-panel 2 to move back and forth, the second sub-panel 2 is disposed between the first sub-panel 1 and the image acquisition unit 3, and the image acquisition unit 3 may be set to correspond to the transparent area of the first sub-panel 1. Therefore, when image acquisition is required, the drive unit 4 drives the second sub-panel 2 to move away from the position corresponding to the transparent area S1 of the first sub-panel 1 (see FIG. 2), that is, the second sub-panel 2 is moved to the position corresponding to the display area S2 of the first sub-panel 1 such that the first sub-panel 1 blocks the second sub-panel 2 and exposes the image acquisition unit 3, and thus the image acquisition unit 3 can acquire an image through the transparent area S1 of the first sub-panel 1; when full-screen display is required, the drive unit 4 drives the second sub-panel 2 to move to the position corresponding to the transparent area S1 of the first sub-panel 1 (see FIG. 1) such that the second sub-panel 2 blocks the image acquisition unit 3, thus, an image displayed by the second sub-panel 2 can be displayed through the transparent area S1 of the first sub-panel 1, and an image displayed in the display area S2 of the first sub-panel 1 and the image displayed by the second sub-panel 2 are combined into a complete image, thereby realizing full-screen display of the display panel.

In some implementations, an area of the orthographic projection of the second sub-panel 2 on the first sub-panel 1 is greater than or equal to an area of the transparent area S1 of the first sub-panel 1, so as to ensure that the second sub-panel 2 can cover the transparent area S1 of the first sub-panel 1 during the full-screen display. When viewing the display panel from a display side of the first sub-panel 1, there is no gap between the transparent area S1 of the first sub-panel 1 and the second sub-panel 2, and the image displayed by the first sub-panel 1 and the image displayed by the second sub-panel 2 can be matched and form a complete display image.

Figure 4:
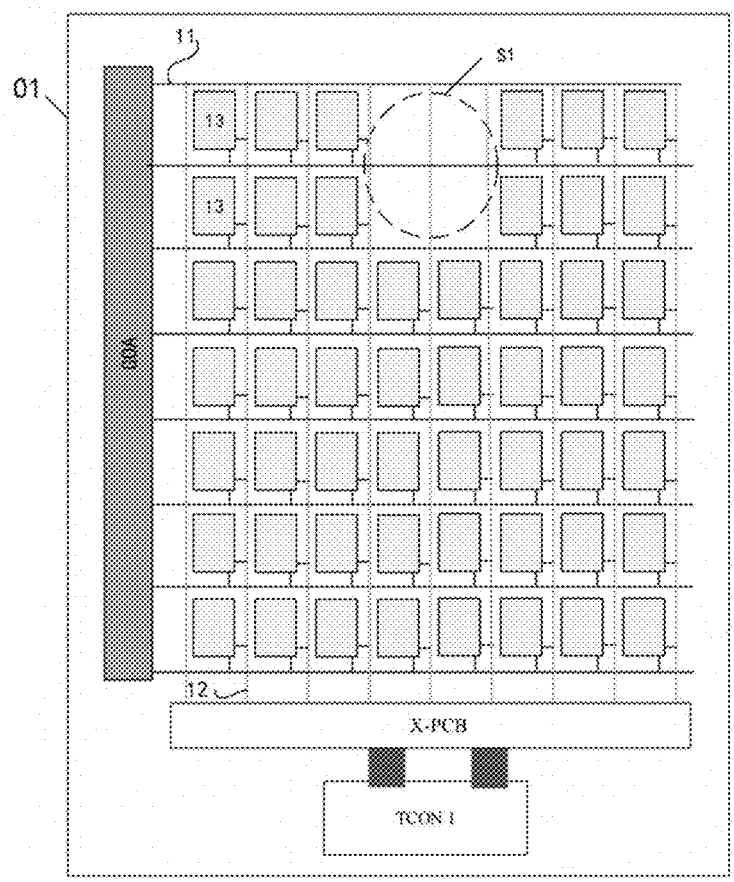
FIG. 4 is a schematic structural diagram of a first sub-panel in a display panel according to an embodiment of the present disclosure.

In some implementations, as shown in FIG. 4, the first sub-panel 1 includes a substrate 01, a plurality of gate lines 11 and a plurality of data lines 12 disposed on a side of the substrate 01 close to a display surface of the first sub-panel 1. The plurality of gate lines 11 extend in a row direction (a first direction), the plurality of data lines 12 extend in a column direction (a second direction), the plurality of gate lines 11 and the plurality of data lines 12 intersect with each other to define a plurality of pixel units 13, and the plurality of pixel units 13 are arranged only in the display area S2 of the first sub-panel 1. Each gate line 11 is connected to one row of pixel units 13, and each data line 12 is connected to one column of pixel units 13. The first sub-panel 1 further includes a gate driver on array (GOA), a source driver circuit board (X-PCB) and a first timing controller (TCON 1). The GOA is connected to the plurality of gate lines 11 and is configured to drive the plurality of gate lines 11. The plurality of data lines 12 are connected to the X-PCB, and the X-PCB is further connected to the TCON 1 to input data voltages to the data lines.

Because each pixel unit 13 needs to be connected to one gate line 11 and one data line 12, in order that pixel units 13 located around the transparent area can operate normally, and transparency of the transparent area S1 of the first sub-panel 1 can be achieved, the plurality of gate lines 11 and the plurality of data lines 12 may be disposed in various manners. Exemplary manners are given below for illustration.

First Manner

Figure 5:
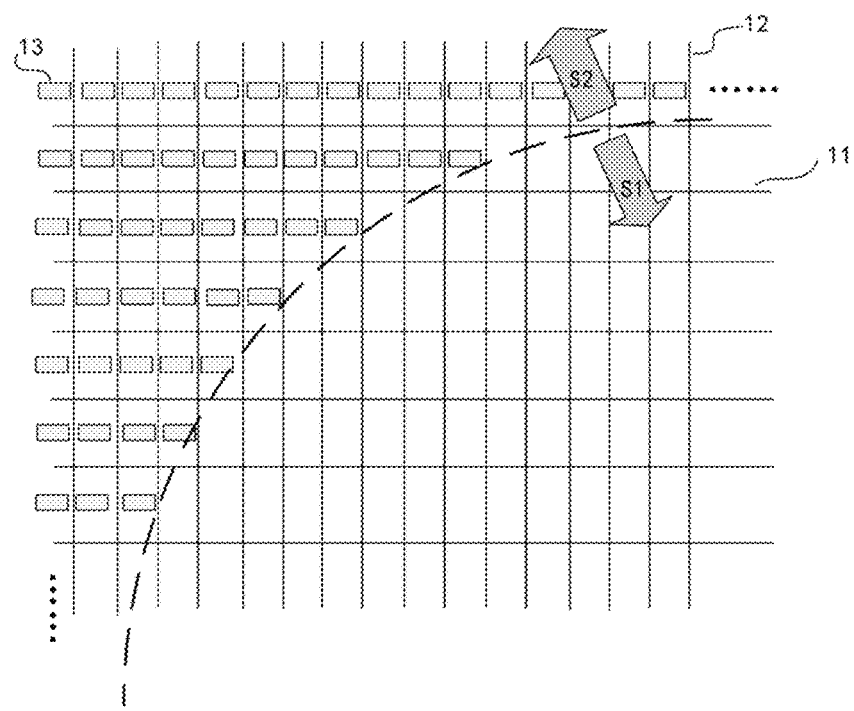
FIG. 5 is a schematic structural diagram of an implementation (first manner) of a transparent area of a first sub-panel in a display panel according to an embodiment of the present disclosure.

As shown in FIG. 5, the plurality of gate lines 11 extend in the row direction, and the plurality of gate lines 11 are arranged in the display area S2 and the transparent area S1. The plurality of data lines 12 extend in the column direction, and the plurality of data lines 12 are arranged in the display area S2 and the transparent area S1. Widths of each gate line 11 and each data line 12 are both at micron level. That is, the plurality of pixel units 13 are arranged only in the display area S2 of the first sub-panel 11, and no pixel unit 13 is arranged in the transparent area S1. The widths of the plurality of gate lines and the plurality of data lines are micron-sized, the plurality of gate lines 11 and the plurality of data lines 12 are normally arranged, and each gate line 11 and each data line 12 that ought to pass through the transparent area S1 are arranged to pass through the transparent area S1. Because the widths of the gate lines 11 and the data lines 12 are both at micron level, human eyes cannot perceive the gate lines 11 and the data lines 12 in the transparent area S1, so that transparency of the transparent area S1 of the first sub-panel 11 can be visually realized.

Second Manner

Figure 6:
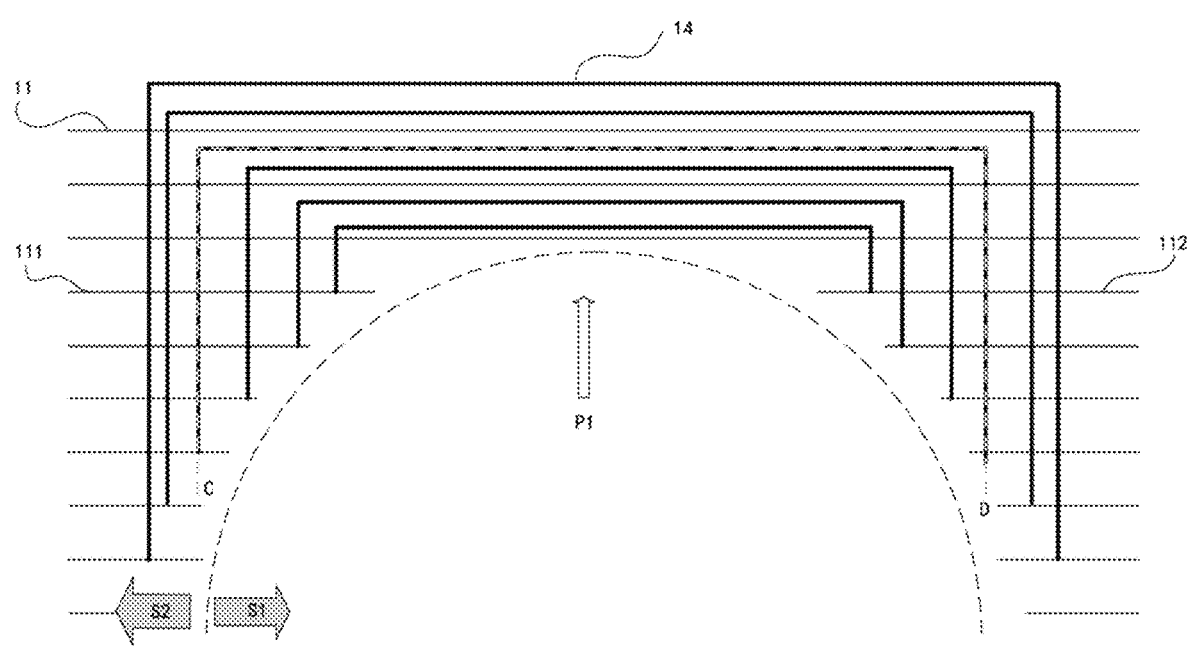
FIG. 6 is a schematic structural diagram of an implementation of a transparent area of a first sub-panel in a display panel according to an embodiment of the present disclosure (a gate line layout in a second manner is shown)
Figure 7:
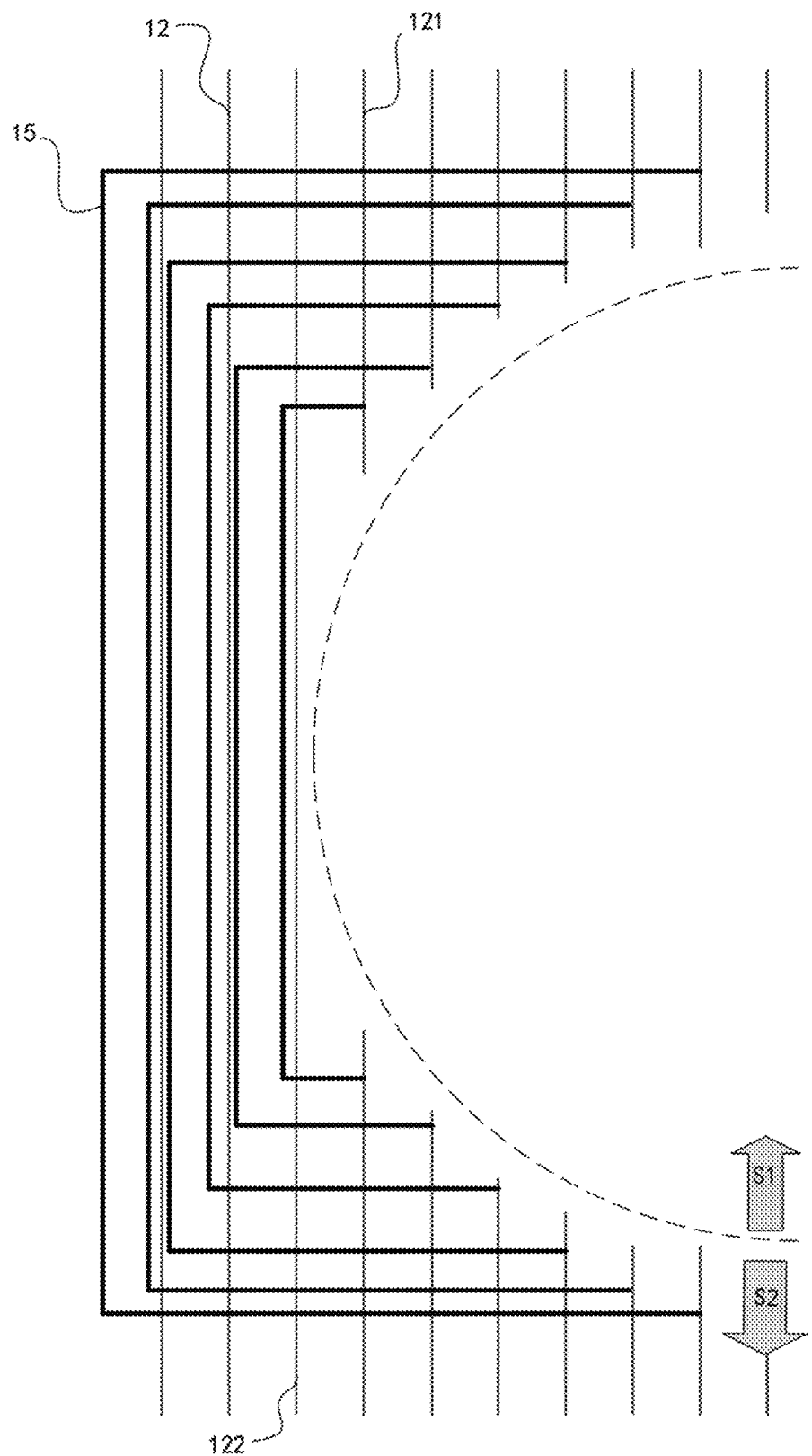
FIG. 7 is a schematic structural diagram of an implementation of a transparent area of a first sub-panel in a display panel according to an embodiment of the present disclosure (a data line layout in a second manner is shown)

As shown in FIGS. 6 and 7, the plurality of gate lines 11 extend along the row direction and are disposed only in the display area S2 of the first sub-panel 1, and/or the plurality of data lines 12 extend along the column direction and are disposed only in the display area S2 of the first sub-panel 1. That is, the plurality of pixel units 13 are only disposed in the display area S2 of the first sub-panel 11, and no pixel unit 13 is disposed in the transparent area S1. The gate lines 11 and the data lines 12 are disposed only in the display area S2 and bypass the transparent area S1 of the first sub-panel 1 by adopting winding lines, so that transmittance of the transparent area S1 of the first sub-panel 1 can be further improved.

Further, as shown in FIG. 6, the first sub-panel 1 further includes a plurality of first bridging lines 14. Gate lines 11, which ought to pass through the transparent area S1 of the first sub-panel, of the plurality of gate lines 11 are each broken at a border of the transparent area S1 and the display area S2 of the first sub-panel 1, so that each of the gate lines 11 is separated into two parts, namely, a first gate line part 111 and a second gate line part 112. Taking one of the gate lines 11 as an example, two ends of a corresponding first bridging line 14 are respectively connected to the first gate line part 11 and the second gate line part 112 of the gate line 11 to connect together the two parts of the gate line 11, and the first bridging line 14 connecting the gate line 11 is disposed only in the display area S2 of the first sub-panel 1 and arranged around the transparent area S1 of the first sub-panel 1. Similarly, the two parts of each gate line 11 that ought to pass through the transparent area S1 of the first sub-panel 1 are connected by the first bridging line 14 corresponding to the gate line 11 to allow normal transmission of a scanning signal on the gate line 11. Furthermore, each first bridging line 14 is disposed around the transparent area S1, therefore, transparency of the transparent area S1 of the first sub-panel 1 can be achieved, and the transmittance of the transparent area S1 can be ensured.

Further, the plurality of first bridging lines 14 do not overlap each other. The plurality of first bridging lines 14 are disposed around the transparent area S1 of the first sub-panel 1, and are sequentially arranged in a direction away from the transparent area S1. For any two adjacent first bridging lines 14, the first bridging line 14 that is farther away from the transparent area S1 surrounds the first bridging line 14 that is closer to the transparent area S1. In some implementations, the plurality of first bridging lines 14 may be disposed on opposite sides of the transparent area S1.

Further, as shown in FIG. 7, similar to the arrangement of the gate lines 11, the data lines 12 may also be arranged in the above manner. The first sub-panel 1 further includes a plurality of second bridging lines 15, and data lines 12, which ought to pass through the transparent area S1 of the first sub-panel 1, of the plurality of data lines 12 are each broken at a border of the transparent area S1 and the display area S2 of the first sub-panel 1, so that each of the data lines 12 is separated into two parts, namely, a first data line part 121 and a second data line part 122. Taking one of the data lines 12 as an example, two ends of a corresponding second bridging line 15 are respectively connected to the first data line part 121 and the second data line part 122 of the data line 12 to connect together the two parts of the data line 12, and the second bridging line 15 connecting the data line 12 is disposed only in the display area of the first sub-panel 1 S2 and arranged around the transparent area S1 of the first sub-panel 1. Similarly, the two parts of each data line 12 that ought to pass through the transparent area S1 of the first sub-panel 1 are connected by the second bridging line 15 corresponding to the data line 12 to allow normal transmission of a data signal on the data line 12. Furthermore, each second bridging line 15 is disposed around the transparent area S1, therefore, transparency of the transparent area S1 of the first sub-panel 1 can be achieved, and the transmittance of the transparent area S1 can be further ensured.

Further, the plurality of second bridging lines 15 do not overlap each other. The plurality of second bridging lines 15 are disposed around the transparent area S1 of the first sub-panel 1, and are sequentially arranged in a direction away from the transparent area S1. For any two adjacent second bridging lines 15, the second bridging line 15 that is farther away from the transparent area S1 surrounds the second bridging line 15 that is closer to the transparent area S1. In some embodiments, the plurality of second bridging lines 15 may be disposed on opposite sides of the transparent area S1.

It should be noted that, for the first sub-panel 1 in the display panel provided in the embodiment, it is possible to separately dispose the gate lines 11 in the manner shown in FIG. 6, or separately dispose the data lines 12 in the manner shown in FIG. 7, or dispose the gate lines 11 and data lines 12 in a manner combining the embodiments illustrated in FIGS. 6 and 7, which can be specifically set as required and is not limited here. It should be noted that when the gate lines 11 are separately disposed in the manner shown in FIG. 6, the data lines 12 may pass through the transparent area, and in this case, the widths of the data lines 12 are in the order of microns. Similarly, when the data lines 12 are separately disposed in the manner shown in FIG. 7, the gate lines 11 may pass through the transparent area, and in this case, the widths of the gate lines 11 are in the order of microns.

Figure 8:
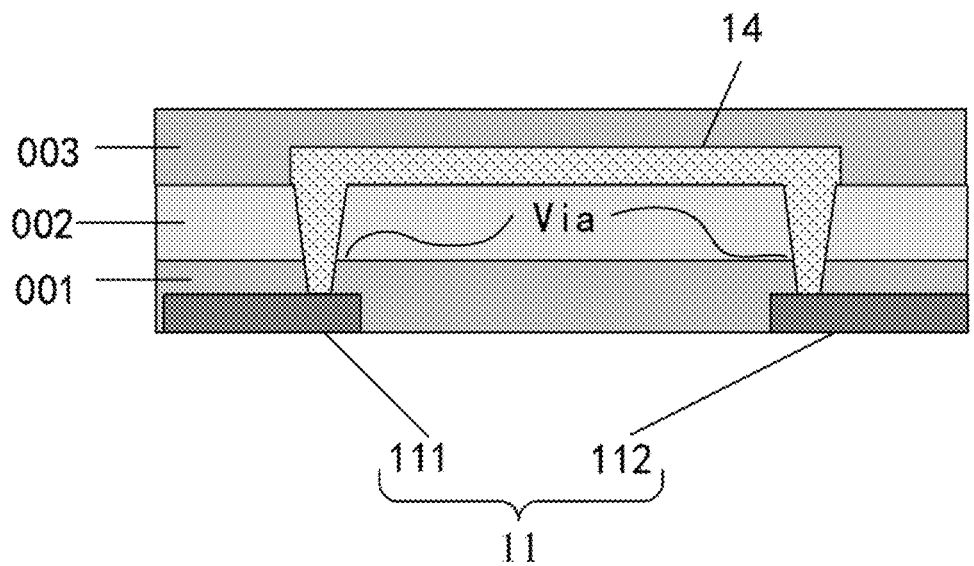
FIG. 8 is a cross-sectional view taken along a direction C-D in FIG. 6.

In some implementations, as shown in FIG. 8, FIG. 8 is a cross-sectional view taken along a direction C-D and viewed along a direction P1 in FIG. 6. In order to prevent the first bridging lines 14 from overlapping with the gate lines 11, a film layer may be separately provided to dispose the first bridging lines 14. The first sub-panel 1 may further include a first additional layer 003. The first additional layer 003 is disposed on a side of a layer 001 where the gate lines 11 are located away from the substrate 01 (not shown in the drawing), and the plurality of first bridging lines 14 are disposed in the first additional layer 003. The first bridging lines 14 and the gate lines 11 are located in different layers, and each first bridging line 14 is connected to the two parts (i.e., the first gate line part 111 and the second gate line part 112) of the gate line 11 corresponding to the first bridging line 14 through vias in the first additional layer 003.

In some implementations, an insulating layer 002 is further disposed between the first additional layer 003 and the layer 001 where the gate lines 11 are located. It should be noted that the first sub-panel 1 may also include more film layers and devices such as thin film transistors, light emitting devices, and the like. For ease of description, FIG. 8 only shows film layers involved in connection relationship between the first bridging lines 14 and the gate lines 11, which do not limit the present application.

Further, in a case where the first sub-panel 1 adopts the second bridging line 15 to connect the two parts of the data line 12, similar to the above, in order to avoid the second bridging lines 15 from overlapping with the data lines 12, a separate film layer may be separately provided to dispose the second bridging lines 15. The first sub-panel 1 may further include a second additional layer. The second additional layer is disposed on a side of a layer where the data lines 12 are located away from the substrate 01, and the plurality of second bridging lines 15 are disposed in the second additional layer. The second bridging lines 15 and the data lines 12 are located in different layers, and each second bridging line 15 is connected to the two parts (i.e., the first data line part 121 and the second data line part 122) of the data line 12 corresponding to the second bridging line 15 through vias in the second additional layer.

It should be noted that, the first additional layer and/or the second additional layer may share a layer structure with other original film layer(s) in the first sub-panel 1, which is not limited here.

In some implementations, for other film layers in the first sub-panel 1, such as a pixel electrode layer disposed on a side of the gate lines 11 and the data lines 12 away from the substrate 01, an area of each film layer corresponding to the transparent area S1 of the first sub-panel 1 may be hollowed out by exposure and development processes using a mask, so as to increase the transmittance of the transparent area S1.

In some implementations, the transparent area S1 of the first sub-panel 1 may be filled with a transparent material of various types, such as a transparent resin, polyimide and the like.

Figure 9:
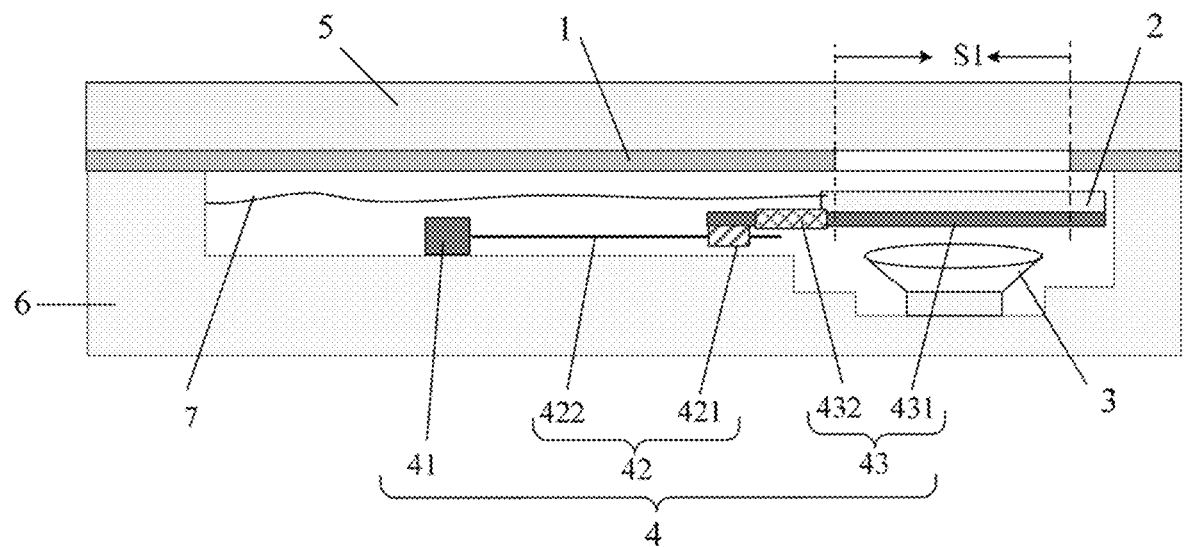
FIG. 9 is a schematic structural diagram of a side of an implementation of a display panel (for full-screen display) according to an embodiment of the present disclosure.
Figure 10:
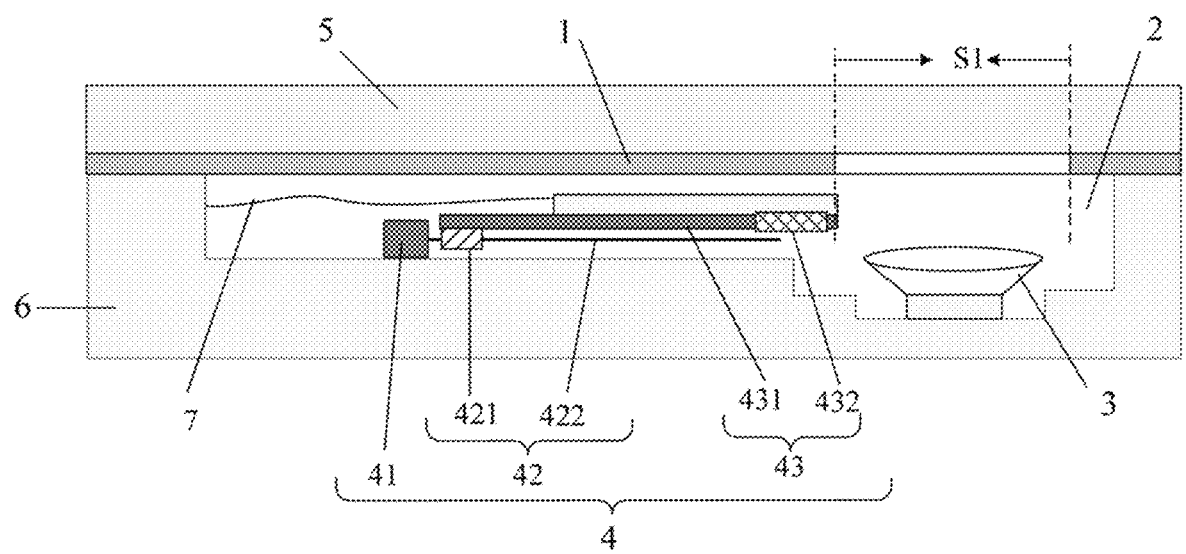
FIG. 10 is a schematic structural diagram of a side of an implementation of a display panel (for image acquisition) according to an embodiment of the present disclosure.

In some implementations, as shown in FIGS. 9 and 10, the drive unit 4 of the display panel includes a drive member 41 and a slide assembly 42. Specifically, a slide part 421 of the slide assembly 42 is fixedly connected to the second sub-panel 2, the drive member 41 is connected to the slide assembly 42, and the drive member 41 can drive the slide part 421 of the slide assembly 42 to move back and forth, so as to drive the second sub-panel 2 to move back and forth between the positions respectively corresponding to the transparent area S1 and the display area S2 of the first sub-panel 1.

In some implementations, the slide assembly 42 includes a fixed part 422 and the slide part 421, and the fixed part 422 extends in a direction in which the second sub-panel 2 moves back and forth. In the embodiment, the extending direction of the fixed part 422 is a direction parallel to the first sub-panel 1. The slide part 421 can slide back and forth along the extending direction of the fixed part 422. The slide part 421 and the fixed part 422 may have structures of various types, and the following descriptions will be given by taking a case where the fixed part 422 is a rotating shaft and the slide part 421 is a sleeve as an example.

Specifically, referring to FIGS. 9 and 10, the rotating shaft 422 in the slide assembly 42 has a rigid structure. The rotating shaft 422 has one end connected to the drive member 41, and extends in the direction parallel to the first sub-panel 1. The sleeve 421 in the slide assembly 42 is connected to a fixing assembly 43 configured to fix the second display sub-panel thereon, and the sleeve 421 is sleeved on the rotating shaft 422. The drive member 41 is connected to the rotating shaft 422 and can drive the rotating shaft 422 to rotate. The sleeve 421 has threads on its inner side, the rotating shaft 422 also has threads on its surface, and the threads of the sleeve 421 are matched with the threads of the rotating shaft 422. When the drive member 41 drives the rotating shaft 422 to rotate, the threads of the sleeve 421 and the threads of the rotating shaft 422 are matched to cause the sleeve 421 to slide back and forth along the rotating shaft 422, so that the second sub-panel 2 connected to the sleeve 421 is driven to slide along the rotating shaft 422 to the position (as shown in FIG. 9) corresponding to the transparent area S1 of the first sub-panel 1 to block the image acquisition unit 3, or slide to the position (as shown in FIG. 10) corresponding to the display area S2 of the first sub-panel 2 to expose the image acquisition unit 3.

As described above, because the rotating shaft 421 can rotate, in order to prevent the second sub-panel 2 from rotating with the rotating shaft, the fixing assembly 43 may be provided to fix an angle between the second sub-panel 2 and the first sub-panel 1, so that the second sub-panel 2 and the first sub-panel 1 are always kept parallel to each other during the reciprocating sliding of the second sub-panel 2. Specifically, referring to FIGS. 9 and 10, the drive unit 44 may further include the fixing assembly 43. The fixing assembly 43 is connected to the second sub-panel 2, and is configured to fix an angle of the second sub-panel 2 to keep the second sub-panel 2 parallel to the first sub-panel 1, so that when the second sub-panel 2 slides to the position corresponding to the transparent area S1 of the first sub-panel 1, images displayed by the two sub-panels can be merged into a complete display image.

Figures 11, 12:
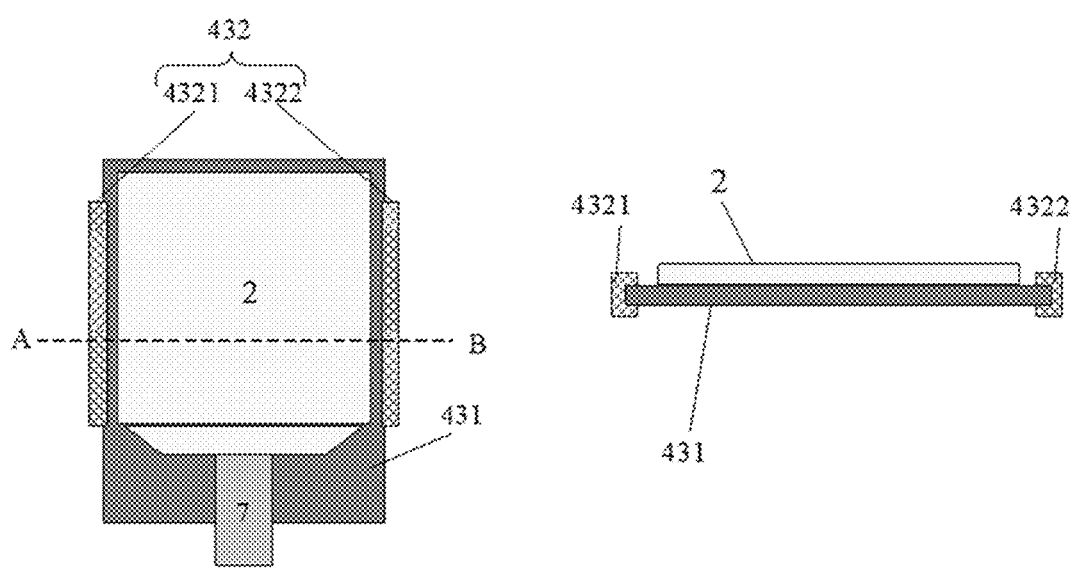
FIG. 11 is a schematic structural diagram of an implementation of a fixing assembly of a display panel according to an embodiment of the present disclosure.
FIG. 12 is a cross-sectional view taken along a direction A-B in FIG. 11.

In some implementations, as shown in FIGS. 9 to 12, FIG. 12 is a cross-sectional view taken along a direction A-B in FIG. 11. The display panel further includes a frame structure 6, and the frame structure may be configured to accommodate and fix structures and components in the display panel. The fixing assembly 43 in the drive unit 4 may include a fixing plate 431 and a clamping member 432. The second sub-panel 2 is disposed on a side of the fixing plate 431 close to the first sub-panel 1. In the embodiment, the slide part 421 (e.g., sleeve) in the slide assembly 42 is connected to the fixing plate 431, and the clamping member 432 is fixed on the frame structure 6 of the display panel. The clamping member 432 has two slots, which are a first slot 4321 and a second slot 4322, respectively, and lengthwise directions of both the first slot 4321 and the second slot 4322 are parallel to the first sub-panel 1. The first slot 4321 and the second slot 4322 are respectively located on two sides of the fixing plate 431 to clamp and hold the fixing plate 431 between the two slots. The fixing plate 431 can slide along the two slots, that is, the fixing plate 431 slides along the lengthwise direction (parallel to the direction of the first sub-panel 1) of the two slots, so that the two slots can fix the angle between the fixing plate 431 and the first sub-panel 1. Therefore, the fixing plate 431 is prevented from rotating with the rotation of the rotating shaft 422, and in turn, the angle between the second sub-panel 2 placed on the fixing plate 431 and the first sub-panel 1 can be fixed, so as to keep the second sub-panel 2 and the first sub-panel 1 parallel to each other. When the sleeve 421 slides along the rotating shaft 422, the sleeve 421 drives the fixing plate 431 to slide along the rotating shaft 422 and also along the two slots of the clamping member 42 (the two slots are fixed to the frame structure 6 and thus keep still), so that the second sub-panel 2 disposed on the fixing plate 431 is driven to slide along the rotating shaft 422.

In some implementations, the drive member 41 may be various devices that can provide power, for example, the drive member 41 may be a stepping motor, and the stepping motor can cause the second sub-panel 2 to slide back and forth when rotating forwardly or reversely. The drive member 41 is also fixed on the frame structure.

In some implementations, as shown in FIGS. 9 to 11, the display panel further includes a flexible printed circuit (FPC) 7 having one end connected to the second sub-panel 2 and another end connected to a driving circuit (not shown in the drawings) of the second sub-panel 2. The driving circuit may be disposed on the frame structure 6, and the FPC 7 has a length greater than a moving distance of the reciprocating motion of the second sub-panel 2, so that the FPC 7 can be folded or stretched with the reciprocating motion of the second sub-panel 2.

It should be noted that the image acquisition unit 3 may also be fixed on the frame structure 6, and the image acquisition unit 3 may be, for example, a camera.

Figure 13:
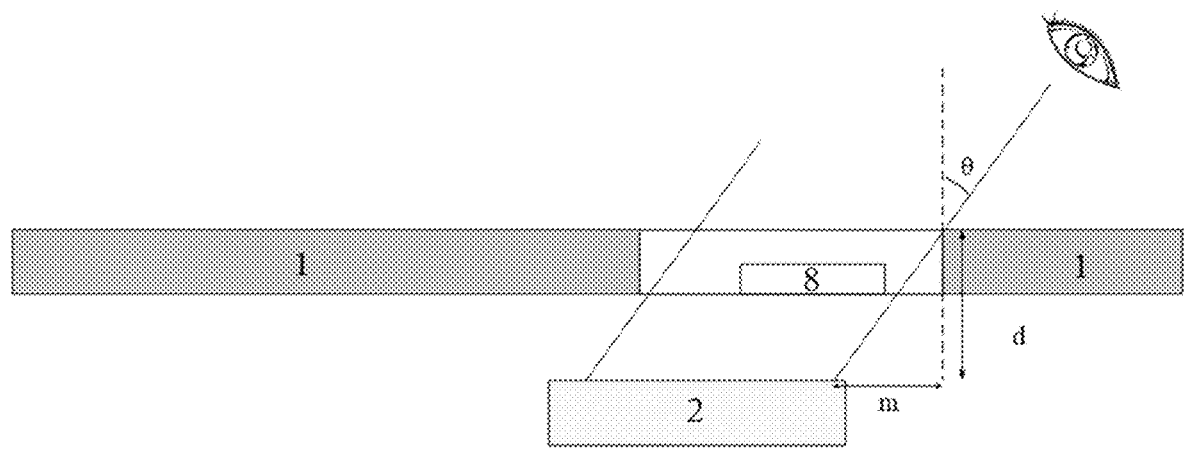
FIG. 13 is a schematic diagram illustrating operating principle of an determination unit of a display panel according to an embodiment of the present disclosure.
Figure 14:
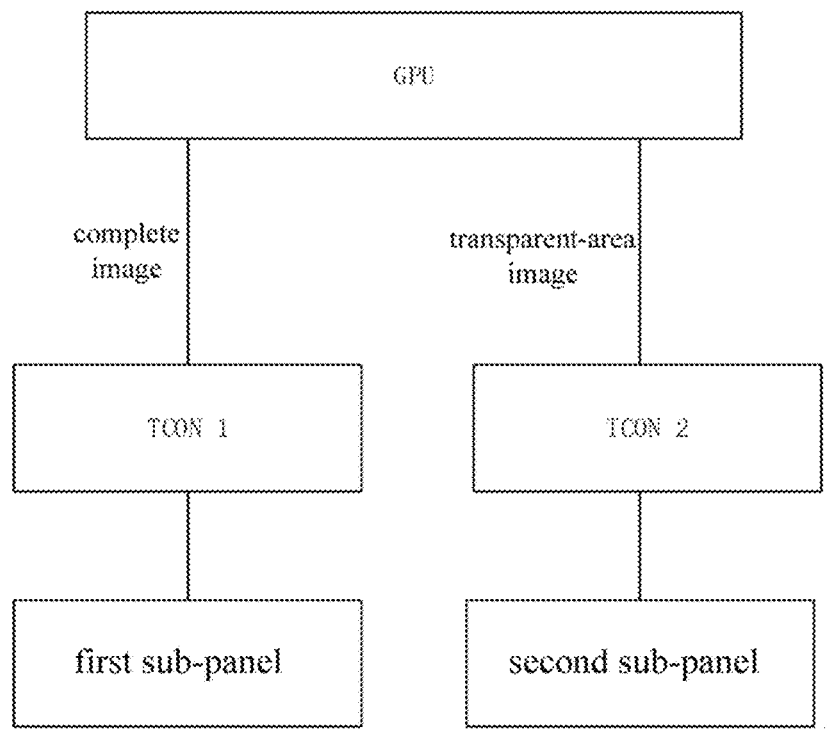
FIG. 14 is a schematic diagram illustrating driving principle of a display panel according to an embodiment of the present disclosure.

In some implementations, as shown in FIG. 13, the display panel provided in the embodiment may further include a determination unit 8. The determination unit 8 is connected to the drive unit 4, and is configured to identify an angle between a line of sight of a human eye and the display panel and adjust a relative position between the second sub-panel 2 and the transparent area S1 of the first sub-panel 1 according to the angle between the line of sight of the human eye and the display panel. When the human eye observes the display panel, because there is a distance d between surfaces of the first sub-panel 1 and the second sub-panel 2 close to the human eye, dislocation may occur if the angle between the line of sight of the human eye and the display panel is not equal to 90°, so that images displayed by the first sub-panel 1 and the second sub-panel 2 are dislocated. Therefore, the determination unit 8 is configured to identify the angle θ between the line of sight of the human eye and the display panel, calculate, using a preset algorithm, a dislocation distance m of the second sub-panel 2 relative to the transparent area S1 of the first sub-panel 1 according to the vertical distance d between the first sub-panel 1 and the second sub-panel 2 and the angle θ between the line of sight and the display panel, and adjust the position of the second sub-panel 2 relative to the transparent areas S1 of the first sub-panel 1 according to the dislocation distance m. Specifically, the dislocation distance m may be determined according to m=d×tan θ. Taking an intersection of a perpendicular of a boundary of the transparent area S1 close to the human eye with respect to the second sub-panel 2 and a plane where the second sub-panel 2 is located as a starting position, the second sub-panel 2 moves a distance m away from the starting position to eliminate the image dislocation, so that the image displayed by the first sub-panel 1 can be fitted with the image displayed by the second sub-panel 2 to form a complete image. For example, the vertical distance d between the first sub-panel 1 and the second sub-panel 2 is 0.2 mm, the angle θ between the line of sight of the human eye and the display panel is 45°, and then the dislocation distance m of the second sub-panel 2 is 0.2 mm.

In some implementations, the display panel may further include a graphics processing unit (GPU), a first timing controller (TCON 1) and a second timing controller (TCON 2). TCON 1 is connected to the GPU and the first sub-panel 1, and TCON 2 is connected to the GPU and the second sub-panel 2. The GPU receives data of a whole image, processes the data of the whole image, generates a complete image and a transparent-area image corresponding to the position of the transparent area S1 of the first sub-panel 1 in the whole image, and then sends data of the complete image to TCON 1 and data of the transparent-area image to TCON2, so that TCON 1 controls the pixel units on the first sub-panel 1 to display, and TCON 2 controls the pixel units on the second sub-panel 2 to display. In addition, the first sub-panel 1 may be refreshed from a side close to the transparent area S1, the first sub-panel 1 and the second sub-panel 2 are turned on almost simultaneously, and therefore, there is no need to perform synchronization on the two sub-panels.

In the display panel provided by the above embodiments, the image acquisition unit does not occupy a position of the display area of the display panel, and full-screen display of the display panel can be achieved.

Correspondingly, the embodiments also provide a display device including the above display panel.

It should be noted that the display device provided in the embodiments may be any product or component with a display function, such as a mobile phone, a tablet computer, a television, a monitor, a notebook computer, a digital photo frame, a navigator, and the like. The display device also includes other essential components as understood by those of ordinary skill in the art, which will not be repeated here, and should not be regarded as a limitation of the present disclosure.

Further, the display device may also include various types of display devices, such as a liquid crystal display device, an organic electroluminescence display device, a mini light emitting diode (Mini LED) display device, a liquid crystal display device, and the like, which is not limited here.

It could be understood that the above implementations are only exemplary implementations for describing the principle of the present disclosure, but the present disclosure is not limited thereto. Various modifications and improvements may be made by those of ordinary skill in the art without departing from the spirit and essence of the present disclosure, and these modifications and improvements are also regarded as falling within the protection scope of the present disclosure.

What is claimed is:

1. A display panel, comprising:
a first sub-panel having a transparent area and a display area surrounding the transparent area;
a second sub-panel on a side of the first sub-panel away from a display surface of the first sub-panel;
a drive unit connected to the second sub-panel and capable of driving the second sub-panel to move back and forth between positions respectively corresponding to the transparent area and the display area of the first sub-panel; and
an image acquisition unit on a side of the second sub-panel away from the first sub-panel, an orthographic projection of the image acquisition unit on the first sub-panel being within the transparent area,
wherein the first sub-panel comprises a substrate, a plurality of gate lines and a plurality of data lines on a side of the substrate close to the display surface; wherein
the plurality of gate lines extend along a first direction and are arranged only in the display area;
and/or,
the plurality of data lines extend along a second direction and are arranged only in the display area, and
wherein in a case where the plurality of gate lines are arranged only in the display area, the first sub-panel further comprises a plurality of first bridging lines, and gates lines, which ought to pass through the transparent area, of the plurality of gate lines are each broken at a border between the transparent area and the display area and separated into two parts, and each of the plurality of first bridging lines is arranged in the display area and connects together the two parts into which a gate line corresponding thereto is separated;
and/or
in a case where the plurality of data lines are arranged only in the display area, the first sub-panel further comprises a plurality of second bridging lines, and data lines, which ought to pass through the transparent area, of the plurality of data lines are each broken at a border between the transparent area and the display area and separated into two parts, and each of the plurality of second bridging lines is arranged in the display area and connects together the two parts into which a data line corresponding thereto is separated.

2. The display panel of claim 1, wherein an area of an orthographic projection of the second sub-panel on the first sub-panel is greater than or equal to an area of the transparent area.

3. The display panel of claim 1, wherein the transparent area is circular in shape.

4. The display panel of claim 1, wherein the first sub-panel comprises a substrate, a plurality of gate lines and a plurality of data lines on a side of the substrate close to the display surface; wherein
the plurality of gate lines extend along a first direction and are arranged in the display area and the transparent area;
the plurality of data lines extend along a second direction and are arranged in the display area and the transparent area; and
widths of both the plurality of gate lines and the plurality of data lines are micron-sized.

5. The display panel of claim 1, wherein in a case where the plurality of gate lines or the plurality of data lines are also arranged in the transparent area, widths of the plurality of gate lines or the plurality of data lines are micron-sized.

6. The display panel of claim 1, wherein in a case where the plurality of gate lines are arranged only in the display area, the first sub-panel further comprises a first additional layer, the first additional layer is on a side of a layer where the plurality of gate lines are located away from the substrate, the plurality of first bridging lines are in the first additional layer, and each of the plurality of first bridging lines is connected to the two parts of the gate line corresponding thereto through vias in the first additional layer;
and/or,
in a case where the plurality of data lines are arranged only in the display area, the first sub-panel further comprises a second additional layer, the second additional layer is on a side of a layer where the plurality of data lines are located away from the substrate, the plurality of second bridging lines are in the second additional layer, and each of the plurality of second bridging lines is connected to the two parts of the data line corresponding thereto through vias in the second additional layer.

7. A display device, comprising the display panel of claim 1.

8. The display panel of claim 1, wherein the drive unit comprises a drive member and a slide assembly; wherein
the slide assembly is fixedly connected with the second sub-panel, the drive member is connected with the slide assembly, and the drive member drives the slide assembly to move back and forth to drive the second sub-panel to move back and forth.

9. The display panel of claim 8, wherein the drive unit further comprises a fixing assembly; the slide assembly comprises a fixed part and a slide part, the fixed part is a rotating shaft, and the slide part is a sleeve; wherein
the fixing assembly is connected with the second sub-panel, and is configured to fix the second sub-panel and keep the second sub-panel parallel to the first sub-panel;
the sleeve is fixedly connected with the fixing assembly and is sleeved on the rotating shaft, and the drive member is connected with the rotating shaft to drive the rotating shaft to rotate; and
an inner side of the sleeve is provided with threads, a surface of the rotating shaft is provided with threads, the threads of the sleeve are matched with the threads of the rotating shaft, and the sleeve drives the second sub-panel to move back and forth along the rotating shaft when the rotating shaft rotates.

10. The display panel of claim 9, wherein the fixing assembly comprises a fixing plate and a clamping member; wherein
the second sub-panel is placed and fixed on a side of the fixing plate close to the first sub-panel; and
the clamping member has two slots, the two slots are located on two sides of the fixing plate to clamp and hold the fixing plate between the two slots, and the fixing plate is slideable along the two slots.

11. The display panel of claim 10, further comprising a frame structure, wherein the clamping member and the drive member are fixed on the frame structure of the display panel.

12. The display panel of claim 8, further comprising: an determination unit electrically connected to the drive unit and configured to identify an angle between a line of sight of a human eye and the display panel and drive the drive unit to drive the second sub-panel to move according to the angle, so as to adjust a relative position of the second sub-panel to the transparent area.

13. The display panel of claim 1, further comprising: a graphics processing unit, a first timing controller and a second timing controller; wherein
the first timing controller is connected to the graphics processing unit and the first sub-panel, and the second timing controller is connected to the graphics processing unit and the second sub-panel.

14. A display panel, comprising:
a first sub-panel having a transparent area and a display area surrounding the transparent area;
a second sub-panel on a side of the first sub-panel away from a display surface of the first sub-panel;
a drive unit connected to the second sub-panel and capable of driving the second sub-panel to move back and forth between positions respectively corresponding to the transparent area and the display area of the first sub-panel; and
an image acquisition unit on a side of the second sub-panel away from the first sub-panel, an orthographic projection of the image acquisition unit on the first sub-panel being within the transparent area, wherein the drive unit comprises a drive member and a slide assembly;
the slide assembly is fixedly connected with the second sub-panel, the drive member is connected with the slide assembly, and the drive member drives the slide assembly to move back and forth to drive the second sub-panel to move back and forth, and wherein
the drive unit further comprises a fixing assembly; the slide assembly comprises a fixed part and a slide part, the fixed part is a rotating shaft, and the slide part is a sleeve; wherein
the fixing assembly is connected with the second sub-panel, and is configured to fix the second sub-panel and keep the second sub-panel parallel to the first sub-panel;
the sleeve is fixedly connected with the fixing assembly and is sleeved on the rotating shaft, and the drive member is connected with the rotating shaft to drive the rotating shaft to rotate; and
an inner side of the sleeve is provided with threads, a surface of the rotating shaft is provided with threads, the threads of the sleeve are matched with the threads of the rotating shaft, and the sleeve drives the second sub-panel to move back and forth along the rotating shaft when the rotating shaft rotates.

15. The display panel of claim 14, wherein the fixing assembly comprises a fixing plate and a clamping member; wherein
the second sub-panel is placed and fixed on a side of the fixing plate close to the first sub-panel; and
the clamping member has two slots, the two slots are located on two sides of the fixing plate to clamp and hold the fixing plate between the two slots, and the fixing plate is slideable along the two slots.

16. The display panel of claim 15, further comprising a frame structure, wherein the clamping member and the drive member are fixed on the frame structure of the display panel.

17. The display panel of claim 14, further comprising: an determination unit electrically connected to the drive unit and configured to identify an angle between a line of sight of a human eye and the display panel and drive the drive unit to drive the second sub-panel to move according to the angle, so as to adjust a relative position of the second sub-panel to the transparent area.

18. A display device, comprising the display panel of claim 17.

19. A display device, comprising the display panel of claim 14.

20. A display panel, comprising:
a first sub-panel having a transparent area and a display area surrounding the transparent area;
a second sub-panel on a side of the first sub-panel away from a display surface of the first sub-panel;
a drive unit connected to the second sub-panel and capable of driving the second sub-panel to move back and forth between positions respectively corresponding to the transparent area and the display area of the first sub-panel;
an image acquisition unit on a side of the second sub-panel away from the first sub-panel, an orthographic projection of the image acquisition unit on the first sub-panel being within the transparent area; and
a graphics processing unit, a first timing controller and a second timing controller; wherein
the first timing controller is connected to the graphics processing unit and the first sub-panel, and the second timing controller is connected to the graphics processing unit and the second sub-panel; and
wherein the graphics processing unit is configured to respectively output complete image data to the first timing controller, and output transparent-area image data corresponding to a position of the transparent area in the complete image data to the second timing controller;
the first timing controller is configured to control the first sub-panel to display a complete image; and
the second timing controller is configured to control the second sub-panel to display a transparent-area image.

* * * * *